(12) United States Patent
Rokhsaz

(10) Patent No.: US 6,504,432 B1
(45) Date of Patent: Jan. 7, 2003

(54) TUNABLE, DYNAMIC, AND SELF-BIASING DIFFERENTIAL AMPLIFIER AND APPLICATION THEREOF

(75) Inventor: Shahriar Rokhsaz, Austin, TX (US)

(73) Assignee: Xilinx, Inc., San Jose, CA (US)

(*) Notice: Subject to any disclaimer, the term of this patent is extended or adjusted under 35 U.S.C. 154(b) by 119 days.

(21) Appl. No.: 09/823,653

(22) Filed: Mar. 30, 2001

(51) Int. Cl.[7] ............................. H03B 1/00; H04B 1/10

(52) U.S. Cl. ..................... 330/258; 330/261; 330/303; 330/305

(58) Field of Search ................................ 330/257, 258, 330/303, 305

(56) References Cited

U.S. PATENT DOCUMENTS 6,407,658 B2 * 6/2002 Kuo ........................... 330/258

FOREIGN PATENT DOCUMENTS

JP 2002026734 * 1/2002

OTHER PUBLICATIONS

Banu et al. "Fully Differential Operational Amplifiers with Accurate Output Balancing" IEEE Journal Solid–State Circuits, vol. 23, No. 6, Dec. 1988, pp 1410–1414.*

* cited by examiner

Primary Examiner—Michael B Shingleton
(74) Attorney, Agent, or Firm—Timothy W. Markison; Garlick & Harrison

(57) ABSTRACT

A tunable differential amplifier includes an amplifier circuit, a current mirror, a dynamic current regulator, and a dynamic output common mode regulator. The current mirror is operably coupled to the amplifier circuit and controls the current flowing through each leg of the amplifier circuit. The current through the current mirror is established based on a regulated current provided by the dynamic current regulator and a common mode error current signal provided by the dynamic output common mode regulator. The common mode error signal is representative of an error between the desired output common mode of the amplifier circuit and the actual common mode of the output of the amplifier circuit. The regulated current is based on the common mode of the input of the amplifier circuit. As such, the biasing current and the common mode output of the differential amplifier is dynamically regulated.

27 Claims, 8 Drawing Sheets

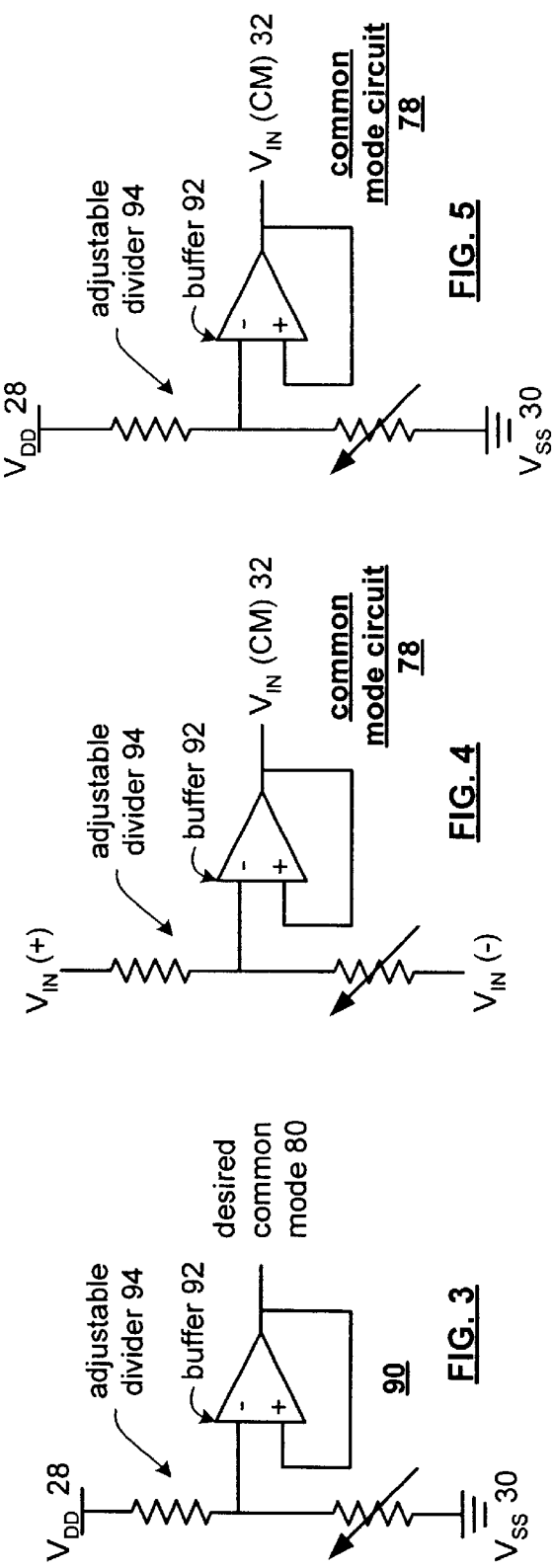
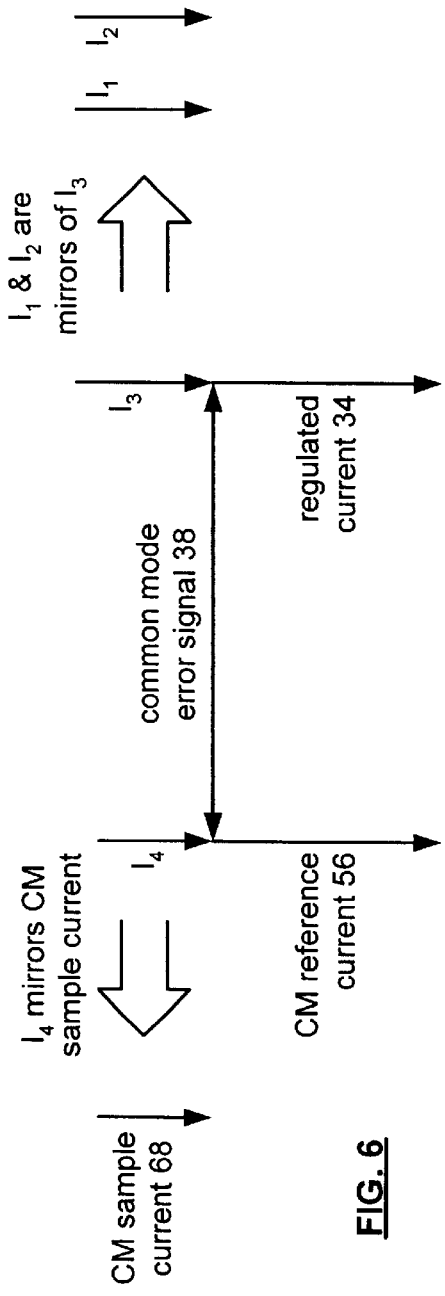

TUNABLE, DYNAMIC, AND SELF-BIASING DIFFERENTIAL AMPLIFIER AND APPLICATION THEREOF

TECHNICAL FIELD OF THE INVENTION

This invention relates generally to amplifiers and in particular to differential amplifiers.

BACKGROUND OF THE INVENTION

Operational amplifiers and operational transconductance amplifiers (collectively referred to as amplifiers) are a basic building block of analog circuits, such as power amplifiers, feedback control systems, line drivers, buffers, filters, et cetera. Depending on the application, the construct of an amplifier will vary. For relatively imprecise and low-grade amplifiers, an amplifier may be constructed from a single transistor, where the transistor is operated based on its properties (e.g., transconductance characteristics for a field effect transistor (FET)).

The design of high performance amplifiers is an ever-increasing challenge, especially in light of the greater performance demands of precision analog circuitry. For example, amplifiers are now required to operate at lower supply voltages (e.g., down to 1.6 volts), but are still required to have a high output swing (2 volts peak-to-peak), increasing bandwidth, excellent linearity (up to 8 bits of linearity), and have good phase margin (90°+/−3°). Some amplifiers have the further design challenge of having a tunable gain and bandwidth requirement.

Current amplifier designs have come close to fulfilling all of these design objectives but have had to compromise one or more design criteria in favor of another. For example, to achieve the high output swing requirement, amplifiers use a differential topology. As with any differential amplifier, the common mode of the output must be controlled to some level such that a maximum output swing may be obtained. Typically, the common mode is controlled using a common mode feedback circuit that controls the current through each leg of the differential amplifier based on a fixed reference common mode voltage. The common mode feedback circuit includes a current mirror and a fixed current source that provides the reference current for the current mirror. As such, the reference current sets the current that flows through each leg of the differential amplifier so that the output common mode voltage is equal to the reference common mode voltage.

While this circuit works well in many applications, the common mode of the differential amplifier will vary with temperature and component mismatches due to the fixed current source of the common mode feedback circuit. Further, if the amplifier is to be tunable (i.e., adjustable gain and bandwidth), the common mode may vary as the amplifier is tuned. As such, headroom and linearity of the amplifier are adversely affected.

Therefore, a need exists for an amplifier (an operational amplifier and/or an operational transconductance amplifier) that operates at low voltages, is tunable, is linear up to 8 bits, has good phase margin, and is insensitive to temperature, component mismatches and other common mode issues.

BRIEF DESCRIPTION OF THE DRAWINGS

FIG. 3 illustrates a schematic block diagram of a desired common mode circuit in accordance with the present invention;

FIGS. 4 and 5 illustrate alternate embodiments for an input common mode circuit in accordance with the present invention;

FIG. 6 illustrates a graphical representation of controlling currents within the tunable, dynamic, and self-biasing differential amplifier in accordance with the present invention;

DETAILED DESCRIPTION OF A PREFERRED EMBODIMENT

Generally, the present invention provides a tunable differential amplifier that is insensitive to common mode issues, temperatures, and component mismatches while still providing highly linear performance, low voltage operation, and excellent headroom. Such a differential amplifier includes an amplifier circuit, a current mirror, a dynamic current regulator, and a dynamic output common mode regulator. The current mirror is operably coupled to the amplifier circuit and controls the current flowing through each leg of the amplifier circuit. The current through the current mirror is established based on a regulated current provided by the dynamic current regulator and a common mode error current signal provided by the dynamic output common mode regulator. The common mode error signal is representative of an error between the desired output common mode of the amplifier circuit and the actual common mode of the output of the amplifier circuit. The regulated current is based on the common mode of the input of the amplifier circuit. As such, the biasing current and the common mode output of the differential amplifier is dynamically regulated. By dynamically regulating the biasing current and common mode, a tunable, dynamic and self-biasing differential amplifier is achieved that operates at low voltages, is tunable, is highly linear, has good phase margin and is insensitive to temperature, component mismatches and common mode issues.

Figure 1:
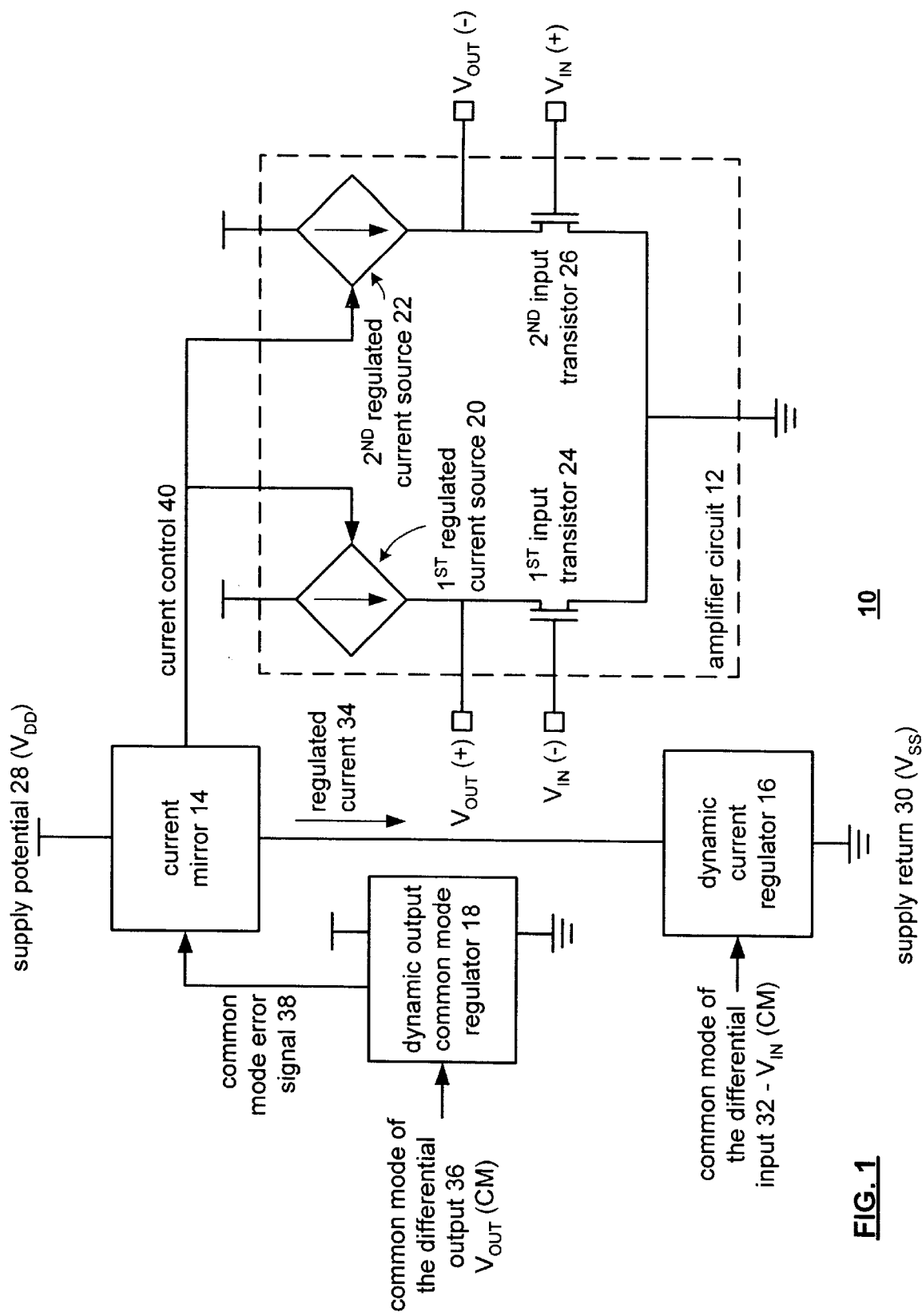
FIG. 1 illustrates a schematic block diagram of a tunable, dynamic, and self-biasing differential amplifier in accordance with the present invention.

The present invention can be more fully described with reference to FIGS. 1 through 11. FIG. 1 illustrates a schematic block diagram of a tunable, dynamic, and self-biasing differential amplifier 10. The differential amplifier 10 includes an amplifier circuit 12, a current mirror 14, a dynamic current regulator 16, and a dynamic output common mode regulator 18. The amplifier circuit 12 includes a $1^{st}$ regulated current source 20, a $2^{nd}$ regulated current source 22, a $1^{st}$ input transistor 24, and a $2^{nd}$ input transistor 26. As shown, the $1^{st}$ input transistor 24 is coupled in series with the $1^{st}$ regulated current source 20. The gate of the $1^{st}$ input transistor 24 is operably coupled to receive one node of a differential input ($V_{in}$ (−)). The node coupling the $1^{st}$ transistor 24 to the 1st regulated current source 20 provides one leg of the differential output ($V_{OUT}$ (+)). As is also shown, the 2nd input transistor 26 is coupled in series with the 2nd regulated current source 22. The 2nd input transistor 26 receives the other leg of the differential input ($V_{IN}$ (+)) at its gate. The node coupling the 2nd input transistor 26 to the 2nd regulated current source 22 provides the other leg of the differential output ($V_{OUT}$ (−)).

The 1st and 2nd regulated current sources 20 and 22 are regulated based on a current control signal 40 provided by current mirror 14. Based on this signal 40, the 1and 2nd regulated current sources 20 produce a controlled current. The controlled current flows through the 1st and 2nd input transistors 24 and 26. Based on the characteristics of the 1st and 2nd input transistors 24 and 26, the common mode for the differential output is established. As is known for field effect transistors, the transconductance ($G_m$) is based on the gate-to-source voltage, the drain-to-source voltage, and the current through the transistor. In this particular amplifier circuit 12, it is desirable to have the 1st and 2nd input transistors 24 and 26 in the triode state. Therefore, the current mirror produces the current control signal 40 such that the 1st and 2nd current sources 20 and 22 generate a current that keeps the 1st and 2nd input transistors 24 and 26 in the triode state.

The current mirror 14 produces the current control signal 40 based on a regulated current 34 and a common mode error signal 38. As shown, the current mirror 14 is operably coupled to a supply potential 28 ($V_{DD}$). In general, the current mirror 14 adjusts the regulated current 34 based on the common mode error signal 38. Accordingly, the current control signal 40 is representative of the regulated current 34 adjusted by the common mode error signal 38. This concept will be discussed in greater detail with reference to FIGS. 2 and 6.

The dynamic current regulator 16, which is operably coupled to a return potential, or supply return 30 ($V_{ss}$), produces the regulated current 34 based on the common mode of the differential input ($V_{IN}$ (cm)). The common mode of the differential input 32 may be generated by sampling the differential input to produce a common mode voltage or based on a desired common mode for the differential amplifier. The production of the common mode of the differential input 32 will be discussed in greater detail with reference to FIGS. 4 and 5. The details of the dynamic current regulator 16 will be discussed in greater detail with reference to FIGS. 2, 7 and 8.

The dynamic output common mode regulator 18 produces the common mode error signal 38 based on the common mode of the differential output 36 ($V_{OUT}$ (cm)). The common mode error signal 36 is representative of the difference between the actual common mode of the differential output 36 and a desired common mode voltage. The details of the dynamic output common mode regulator 18 will be discussed in greater detail with reference to FIGS. 2, 6, 7, and 8.

Figure 2:
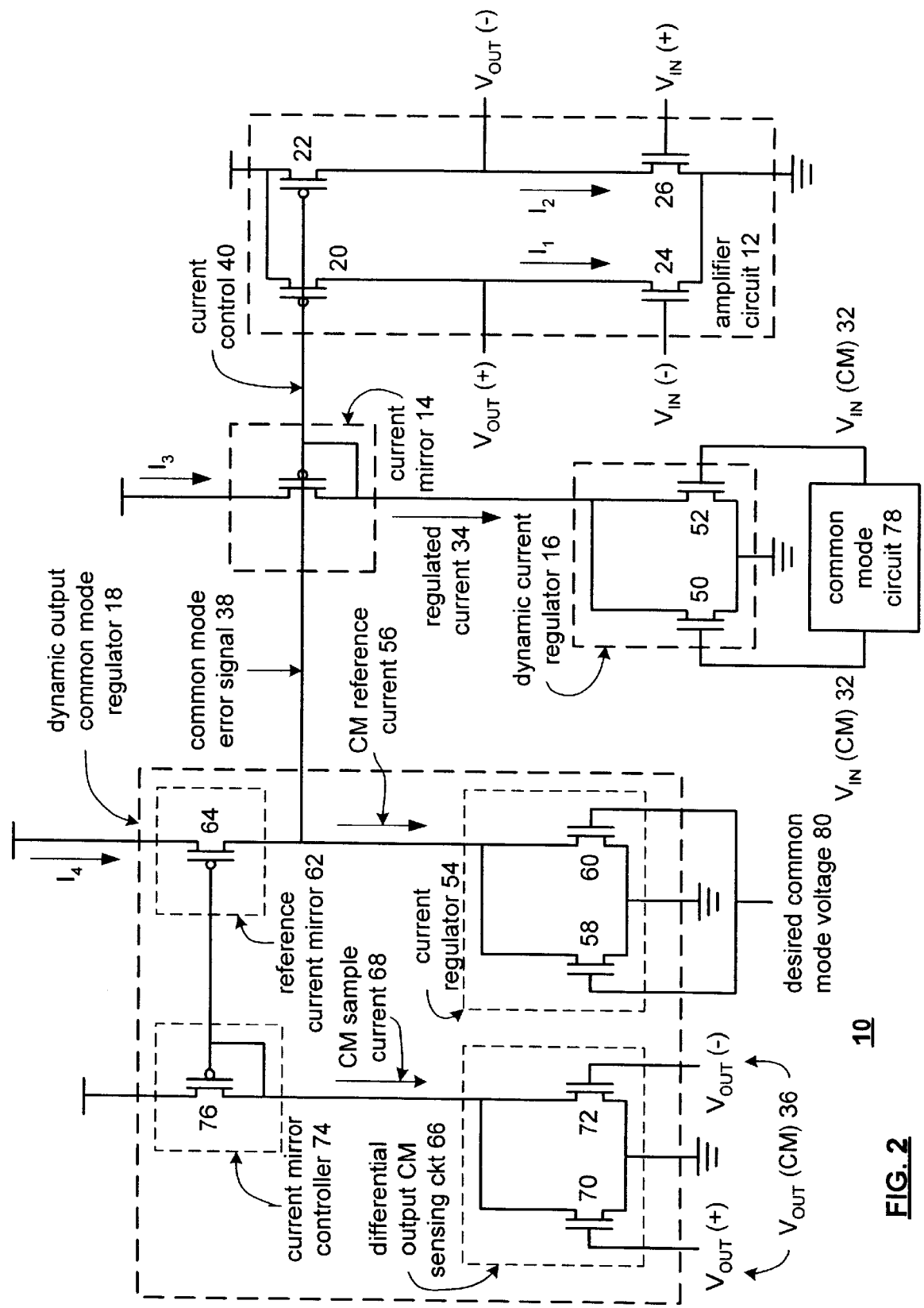
FIG. 2 illustrates a more detailed schematic block diagram of the tunable, dynamic, and self-biasing differential amplifier of FIG. 1.

FIG. 2 illustrates a more detailed schematic block diagram of the differential amplifier 10. The differential amplifier 10 includes the amplifier circuit 12, current mirror 14, the dynamic current regulator 16, and the dynamic output common mode regulator 18. The amplifier circuit 12 includes the 1st and 2nd current source regulators 20 and 22, which are represented by P-channel transistors. The 1st and 2nd input transistors 24 and 26 include N-channel transistors. The 1st current source regulator 20 generates a current ($I_1$) in accordance with the current flowing through the current mirror 14. Similarly, the 2nd current source regulator 22 generates a current ($I_2$) in accordance with the current flowing through the current mirror 14.

Current mirror 14 includes a P-channel transistor. The gate of the current mirror transistor is coupled to the gates of the regulated current sources 20 and 22 of the amplifier circuit 12. In addition, the P-channel transistor of current mirror 14 is a matched transistor to the transistors 20 and 22. As such, the current through transistors 20 and 22 ($I_1$ and $I_2$) will be substantially equal to the current $I_3$ through current mirror 14 times a scaling factor. The scaling factor is representative of a size difference between the matched transistors (e.g., the current mirror transistor and the current source transistors 20 and 22). If the transistors are the same size, then the scaling factor is one such that the currents are equal. If the current mirror transistor is half the size of the current source transistors 20 and 22, then the current through the current source transistors 20 and 22 will be twice the current through the current mirror transistor.

The current $I_3$ into the current mirror 14 is the sum of the regulated current 34 and the current of the common mode error signal 38. The dynamic current regulator 16 produces the regulated current 34 and includes two N-channel transistors 50 and 52. The gates of transistors 50 and 52 are operably coupled to the common mode circuit 78, which produces the common mode of the differential input 32. The drains of transistors 50 and 52 are coupled together such that one-half of the regulated current 34 flows through each of the transistors 50 and 52. The transistors 50 and 52 are matched and sized with respect to the physical characteristics of input transistors 24 and 26 such that the regulated current 34 provides a dynamic biasing current for the input transistors 24 and 26. Accordingly, as the common mode of the differential input 32 varies, the regulated current 34 will be adjusted to provide the desired biasing of amplifier circuit 12.

The dynamic output common mode regulator 18 includes a reference current mirror 62, a current regulator 54, a differential output common mode sensing circuit 66, and a current mirror controller 74. The differential output common mode sensing circuit 66 includes two N-channel transistors 70 and 72. The gates of transistors 70 and 72 are operably coupled to the differential output of amplifier circuit 12 ($V_{OUT}$ (+) and $V_{OUT}$ (−)). The sources of transistors 70 and 72 are operably coupled to the supply return 30. The drains of transistors 70 and 72 are operably coupled together to provide a common mode sample current 68. In the preferred embodiment, the characteristics of transistors 70 and 72 should match those of transistors 24 and 26.

The current mirror controller 74 includes a P-channel transistor 76, which is coupled in series with the differential output common mode sensing circuit 66. The common mode sensing circuit 66 generates a common mode sample current 68, which also flows through the current mirror controller 74. The current regulator 54 includes a pair of N-channel transistors 58 and 60. The gates of the transistors 58 and 60 are operably coupled to receive a desired common mode voltage 80, which may be based on the supply voltage (VDD) and the return potential (VSS). The sources of transistors 58 and 60 are operably coupled to the supply return 30. The drains of transistors 58 and 60 are operably coupled together to sink the common mode reference current 56. In a preferred embodiment, the characteristics of transistors 58 and 60 are matched and sized with respect to the characteristics of transistors 70 and 72.

The reference current mirror 62 includes a P-channel transistor 64 that is operably coupled in series with the current regulator 54. In a preferred embodiment, the characteristics of transistor 64 is matched and sized with respect to transistor 76. The gate of transistor 64 is operably coupled to the gate of transistor 76. As configured, if the common mode sample current 68 matches the common mode reference current 56, indicating that the actual common mode of the differential output is at the desired level, the common mode error signal 38 is zero, i.e., no current is flowing in either direction. If, however, the common mode sample current 68 does not match the common mode reference current 56, current will flow between the current mirror 14 and the reference current mirror 62 as the common mode error signal 38. For example, if the common mode of the differential output is higher than desired, the common mode sample current 68 will be greater than the common mode reference current 56. As such, the common mode error signal 38 will include current that is sourced into current mirror 14. Thus, the current $I_3$ through current mirror 14 will be decreased to source the current of the common mode error signal 38, thereby causing the currents $I_1$ and $I_2$ of the amplifier circuit 12 to corresponding decrease. Such a decrease will cause the common mode of the differential output to increase.

If, however, the common mode of the differential output is less than desired, the common mode sample current 68 will be less than the common mode reference current 56. In this instance, the common mode error signal 38 will sink current from the node coupling the current mirror 14 and the dynamic current regulator 16. Accordingly, the current $I_3$ through current mirror 14 will equal the regulated current 34 plus the current of the error signal 38. Thus, currents $I_1$ and $I_2$ will be increased, thereby increasing the common mode of the differential output.

As one of average skill in the art will appreciate, in the differential amplifier 10, P-channel transistors may be used in place of the N-channel transistors, N-channel transistors may be used in place of the P-channel transistors, and adjusting the coupling of the transistors. For example, input transistors 24 and 26 of the amplifier circuit 12 may be P-channel transistors operably coupled to $V_{DD}$. The regulated current source transistors 20 and 22 may be N-channel transistors coupled in series with the input transistors 24 and 26 and coupled to $V_{SS}$. Similarly, the transistor within current mirror 14 may be an N-channel transistor while transistors within the dynamic current regulator 16 could be P-channel transistors. In this configuration, the P-channel transistors of the dynamic current regulator 16 would be coupled to $V_{DD}$ while the N-channel transistor of the current mirror will be coupled to $V_{SS}$. In the dynamic output common mode regulator 18, transistor 64 would be an N-channel transistor coupled to $V_{SS}$ while transistors 58 and 60 would be P-channel transistors coupled to $V_{DD}$. Also, transistor 76 would be an N-channel transistor coupled to $V_{SS}$ while transistors 70 and 72 would be P-channel transistors coupled to $V_{DD}$.

FIG. 3 illustrates a schematic block diagram of a common mode circuit 90 that is operably coupled to sense the supply potential $V_{DD}$ 28 and a return potential $V_{SS}$ 30 to produce the desired common mode voltage 80. The common mode circuit 90 includes an adjustable divider 94 and may further include an optional buffer 92. The adjustable divider 94 may include resistors wherein at least one of the resistors is a variable resistor. As such, by adjusting the desired common mode 80, the differential amplifier of FIGS. 1 and 2 may be adjusted to a particular common mode operational setting.

FIGS. 4 and 5 illustrate alternate schematic block diagrams of the common mode circuit 78 that produces the common mode of the differential input 32. Both circuits include an adjustable divider 94 and may also include an optional buffer 92. The adjustable divider 94 may be a resistor network wherein at least one of the resistors is a variable resistor. The difference between the common mode circuit 78 of FIG. 4 and the common mode circuit 78 of FIG. 5 is the potentials that are sampled via the adjustable divider 94. In the common mode circuit 78 of FIG. 4, the adjustable divider samples the differential input ($V_{IN}$ (+) and $V_{IN}$ (−)) directly.

In FIG. 5, the adjustable divider samples the supply potential $V_{DD}$ 28 and the supply return $V_{SS}$ 30. Typically, the common mode circuit 78 of FIG. 5 will be used when the differential amplifier is used in a stand-alone configuration. If the differential amplifier is used in a cascaded manner, the $1^{st}$ differential amplifier in the cascaded chain will typically use the common mode circuit 78 of FIG. 5 while the remaining differential amplifiers in the cascaded chain will use the common mode circuit 78 of FIG. 4. As one of average skill in the art will appreciate, the adjustable divider 94 may be adjusted via a controlling device, such as a digital signal processor, programmable gate array, microprocessor, state machine, and/or logic circuitry.

FIG. 6 illustrates a graphical representation of the dynamic regulation of the differential amplifier 10 of FIGS. 1 and 2. In this illustration, currents $I_1$ and $I_2$ (i.e., the currents through each leg of the amplifier circuit 12) are mirrors of the current $I_3$, which is the current flowing into the current mirror 14. The regulated current 34, which is produced by the dynamic current regulator 16 is a set current based on the common mode of the differential input. As such, $I_3$ equals the regulated current 34 plus or minus the current of the common mode error signal 38.

The current of the common mode error signal 38 is a representation of the difference between the common mode reference current 56 and the common mode sample current 68. As shown, $I_4$, which is the current through the reference current mirror 62, mirrors the common mode sample current 68, which flows through current mirror controller 74. The common mode reference current 56, which is produced by the current regulator 54, is a set current based on the common mode of the differential output. The current of the error signal 38 is $I_4$ less the common mode reference current 56. For example, when the common mode sample current 68 equals the common mode reference current 56, $I_4$ equals the common mode reference current 56. As such, the current of the common mode error signal is zero.

If, however, the common mode sample current 68 is greater than the common mode reference current 56, then $I_4$ is greater than the common mode reference current 56. Accordingly, the current of the error signal 38 will be sourced into the node coupling the current mirror 14 and the dynamic current regulator 16. To adjust for the extra current into the node coupling the current mirror 14 and the dynamic current regulator 16, $I_3$ must decrease. As $I_3$ decreases, so must currents $I_1$ and $I_2$ of the amplifier circuit 12.

If the common mode sample current 68 is less then the common mode reference current 56, then $I_4$ is less than the common mode reference current 56. Accordingly, current of the error signal 38 is pulled from the current mirror 14 such that the current of the error signal 38 plus $I_4$ equals the common mode reference current 56. In this instance, $I_3$ must increase to provide the error current into the node coupling the reference current mirror 62 and the current regulator 54. In this case, since $I_3$ is increasing $I_1$ and $I_2$ must also increase.

The regulated current 34 is a set current based on the common mode of the differential input. As such, if the common mode of the differential input varies, the regulated current 34 will vary accordingly. If the regulated current 34 varies, then $I_3$ must also vary. If $I_3$ varies, then $I_1$ and $I_2$ also vary. As such, dynamic biasing of the amplifier is provided based on the common mode of the differential input.

Figure 7:
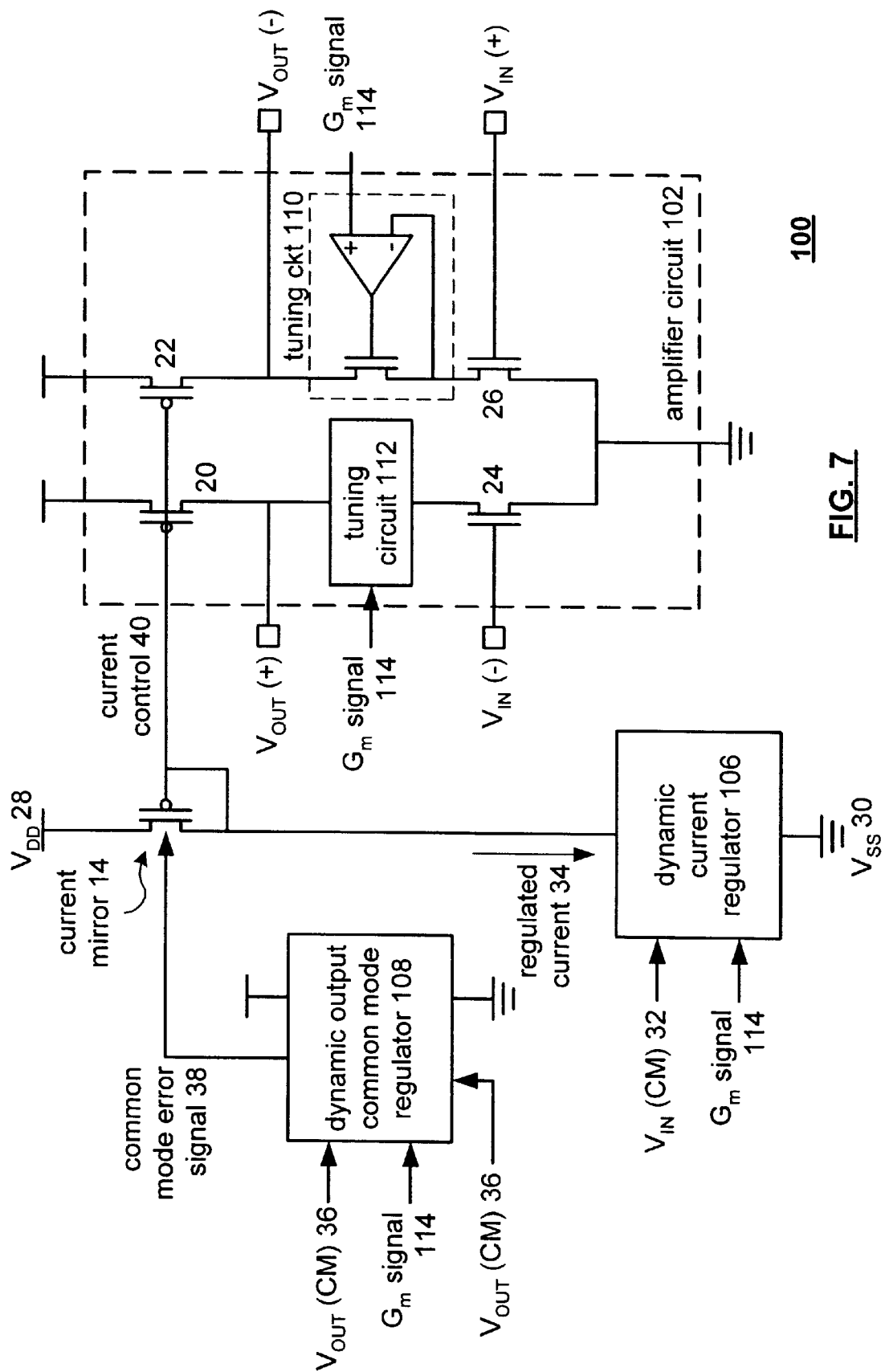
FIG. 7 illustrates a schematic block diagram of an alternate tunable, dynamic, and self-biasing differential amplifier in accordance with the present invention.

FIG. 7 illustrates a schematic block diagram of an alternate differential amplifier 100. The differential amplifier 100 includes an amplifier circuit 102, a current mirror 14, a dynamic current regulator 106, and a dynamic output common mode regulator 108. The amplifier circuit 102 includes input transistors 24 and 26 and regulated current sources 20 and 22. In addition, the amplifier circuit includes tuning circuits 110 and 112. Tuning circuit 110 is operably coupled in series between the $2^{nd}$ regulated current source 22 and the $2^{nd}$ input transistor 26. Tuning circuit 112 is operably coupled in series between the $1^{st}$ input transistor 24 and the $1^{st}$ regulated current source 20.

Each of the tuning circuits 110 and 112 include a N-channel transistor that has its gate operably coupled to an amplifier. One input of the amplifier is coupled to receive a transconductance tuning signal 114 and the other input is coupled to the source of the N-channel transistor. The transconductance signal 114 regulates the transconductance properties of input transistors 24 and 26. By varying the transconductance properties of the input transistors 24 and 26 the transconductance properties of the differential amplifier vary. As such, the gain and/or bandwidth of the differential amplifier 100 can be varied based on the setting of the transconductance signal 114. In the preferred embodiment, the N-channel transistors of the tuning circuit 110 and 112 are biased to remain in a linear state.

The dynamic current regulator 106 produces the regulated current 34 based on the common mode of the differential input 32 and also based upon the transconductance signal 114. The dynamic output common mode regulator 108 produces the common mode error signal 38 based on the common mode of the differential output 36, the desired common mode voltage 80, and on the transconductance signal 114. The current mirror 14 operates to produce the current control signal 40, which is based on the regulated current 34 and the common mode error signal 38.

Figure 8:
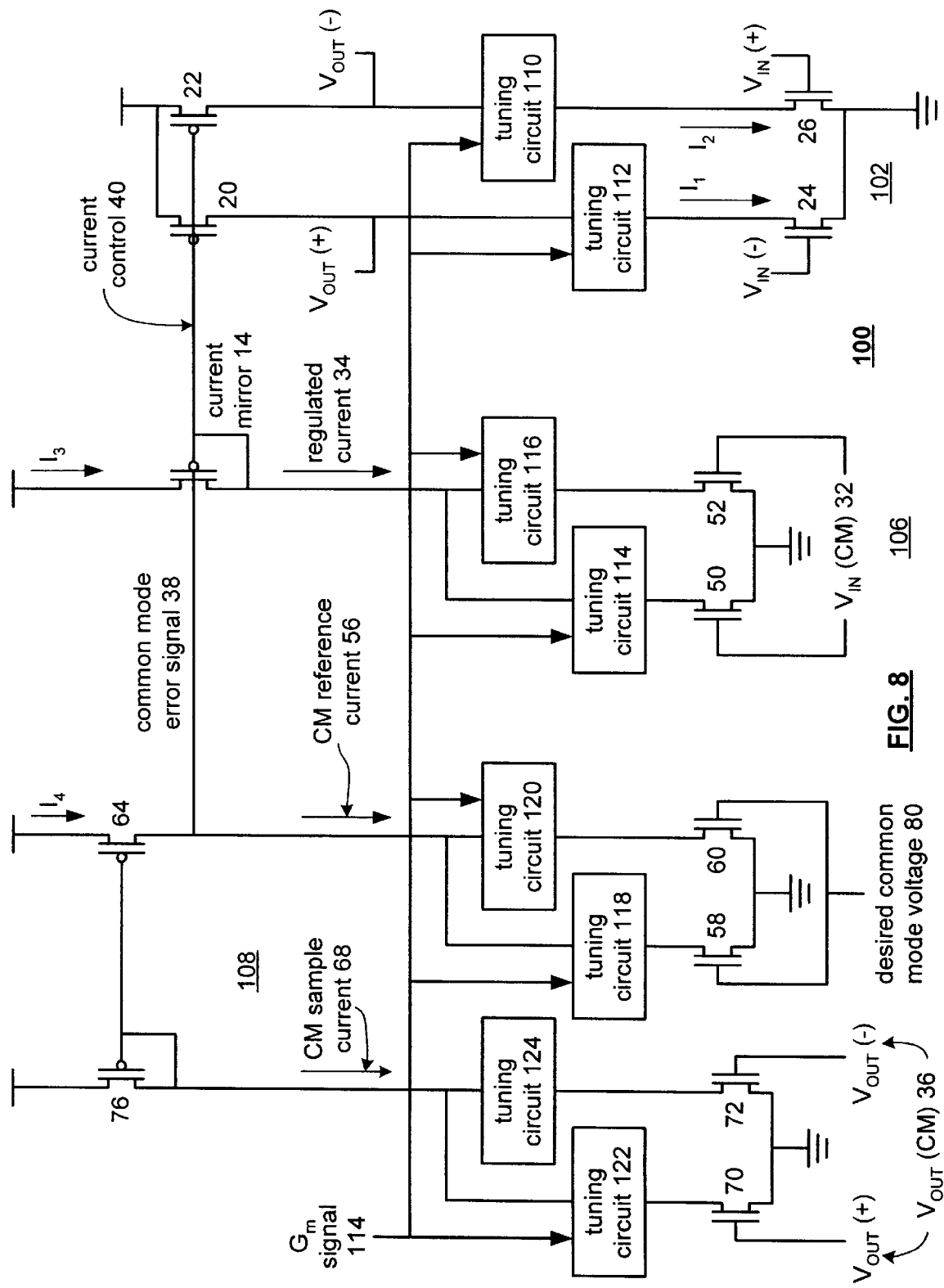
FIG. 8 illustrates a more detailed schematic block diagram of the differential amplifier of FIG. 7.

FIG. 8 illustrates a more detailed schematic block diagram of the differential amplifier 100. The schematic block diagram of FIG. 8 is similar to the schematic block diagram of FIG. 2 with the addition of the tuning circuits 110 through 124 coupled in series with the N-channel transistors 24, 26, 50, 52, 58, 60, 70 and 72. As such, the tuning circuits adjust the transconductance properties of the corresponding transistors, thereby changing the gain and/or bandwidth of the differential amplifier 100.

As is known, by varying the transconductance of a transistor, the current flowing through it changes. As such, the tuning circuits cause the currents in the amplifier circuit 102, the dynamic current regulator 106, and the dynamic output common mode regulator 108 to be adjusted. Using matched transistors in each of these circuits will insure that the current variations will be substantially identical. As with the circuit of FIG. 2, the N-channel transistors may be replaced by P-channel transistors and the P-channel transistors may be replaced by N-channel transistors. As one of average skill in the art will appreciate, a single tuning circuit may be used in each section of the differential amplifier 100. For example, tuning circuit 122 may be omitted and the drain of transistor 70 would be coupled to tuning circuit 124. Tuning circuits 114 and 118 could be similarly omitted.

Figure 9:
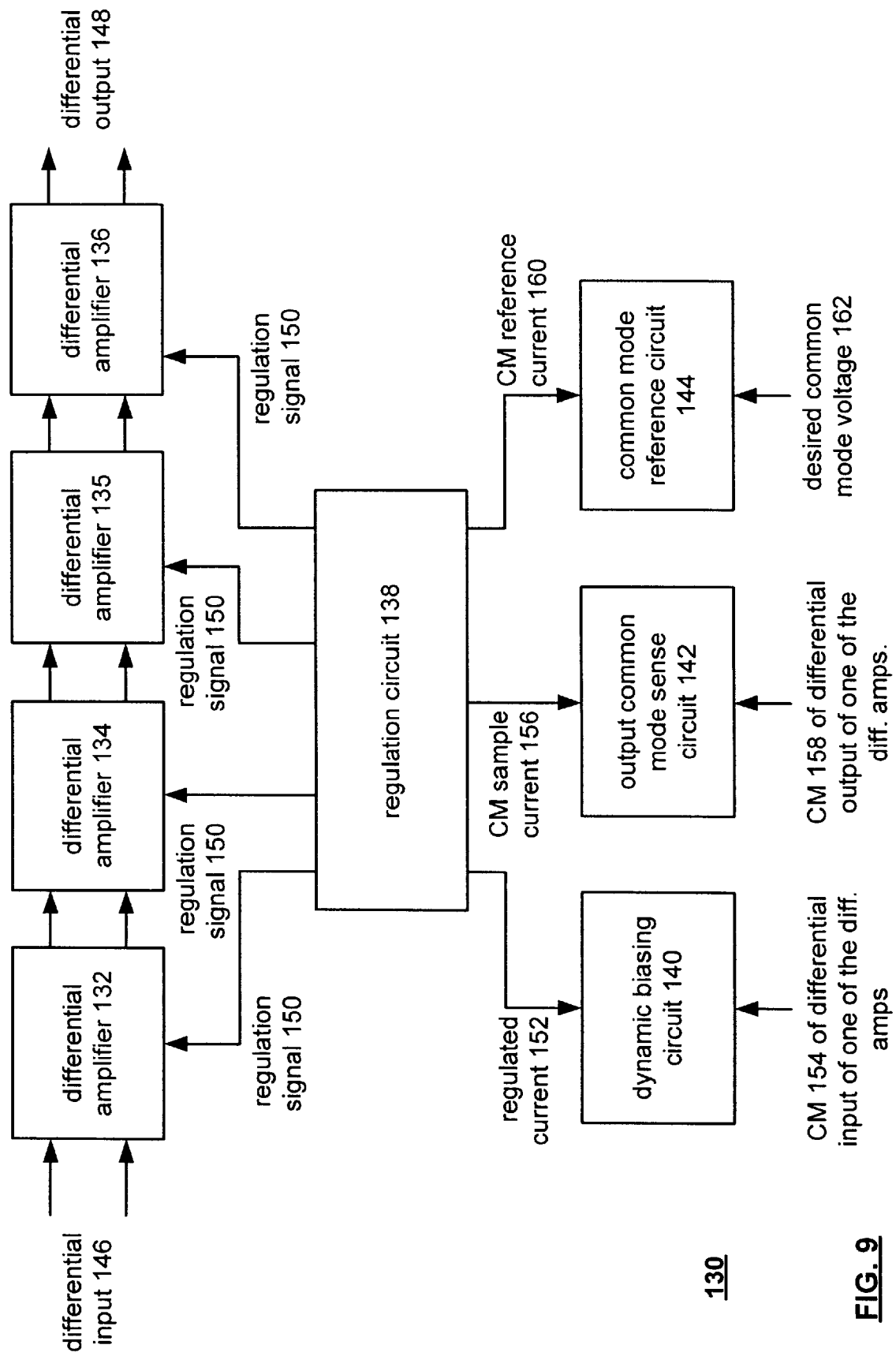
FIG. 9 illustrates a schematic block diagram of a filter in accordance with the present invention.

FIG. 9 illustrates a filter 130 that includes a plurality of differential amplifiers 132, 134, 135, and 136 having a differential input 146 and a differential output 148, a regulation circuit 138, a dynamic biasing circuit 140, an output common mode sense circuit 142, and a common mode reference circuit 144. The dynamic biasing circuit 140 produces a regulated current 152 based on the common mode 154 of a differential input of one of the differential amplifiers 132-136, but is preferably the input of differential amplifier 132. The output common mode sense circuit 142 produces a common mode sample current 156 based on the common mode 158 of the differential output of one of the differential amplifiers 132 through 136. The common mode reference circuit 144 produces a common mode reference current 160 based on a desired common mode voltage 162.

The regulation circuit 138 produces a regulated signal 150 that is provided to each of the differential amplifiers 132-136, where the regulated signal 150 is based on the regulated current 152, the common mode sample current 156, and the common mode reference current 160. The construct of each of the differential amplifiers 132-136 may be similar to the amplifier circuit 12 of FIGS. 1 and 2. Accordingly, the regulation signal 150 regulates the current through a $1^{st}$ current source and a $2^{nd}$ current source which are in series with a $1^{st}$ input transistor and a $2^{nd}$ input transistor, respectively.

Figure 10:
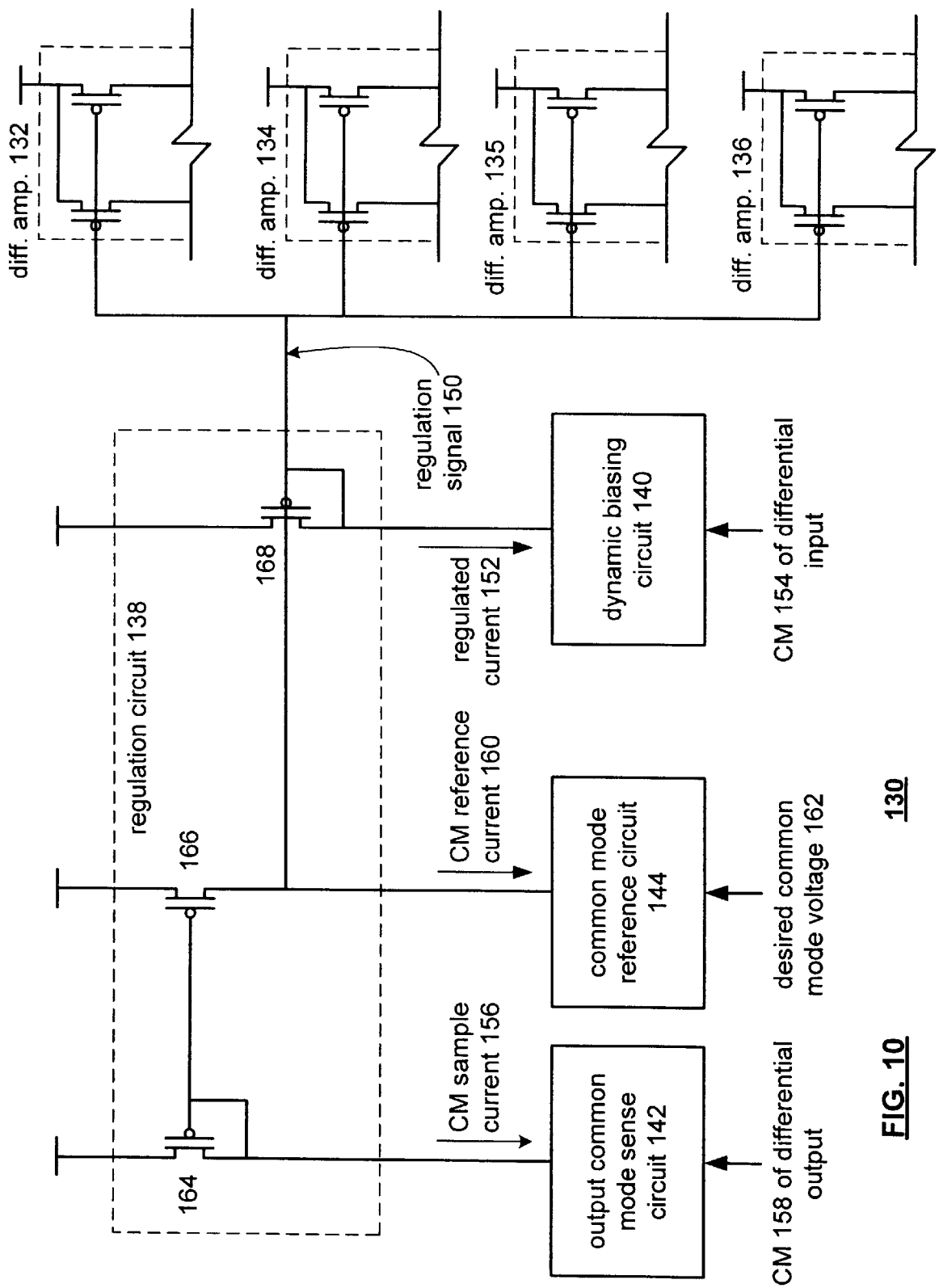
FIG. 10 illustrates a more detailed schematic block diagram of the filter of FIG. 9.

FIG. 10 illustrates a more detailed schematic block diagram of the filter 130. Differential amplifiers 132 through 136 are shown to include P-channel transistors as the $1^{st}$ and $2^{nd}$ current sources which may be the same type of devices used in amplifiers circuit 12. The regulation circuit 138 includes a current mirror controller 164, a $1^{st}$ current mirror 166 and a $2^{nd}$ current mirror 168. The $2^{st}$ current mirror 168 produces the regulation signal 150 that regulates the current through each leg of the differential amplifiers 132 through 136. The current mirror controller 164 is operably coupled in series with the output common mode sense circuit 142 such that the common mode sample current 168 flows through the current mirror controller 164.

The $1^{st}$ current mirror 166 is operably coupled in series with the common mode reference circuit 144. The $2^{nd}$ current mirror 168 is operably coupled in series with the dynamic biasing circuit 140. As previously described with reference to FIG. 6, the regulation signal 150 is based on the current flowing through the $2^{nd}$ current mirror 168, which may be expressed as current $I_3$. Current I3 is representative of the regulated current 152 plus or minus an error current, which is referenced as the common mode error signal 38 in FIG. 6. The error current is based on a difference between the common mode sample current 156 and the common mode reference current 160. If the common mode sample current is greater than the common mode reference current 160, then the error current sources current to the current mirror 168, thus decreasing current $I_3$. Conversely, if the common mode sample current is less than the common mode reference current 160, then the error current sinks current from the current mirror 168, thus increasing current $I_3$. Accordingly, the current in each leg of differential amplifiers 132 through 136 equals, based on sizing of the transistors, the current $I_3$ of the current mirror 168.

Figure 11:
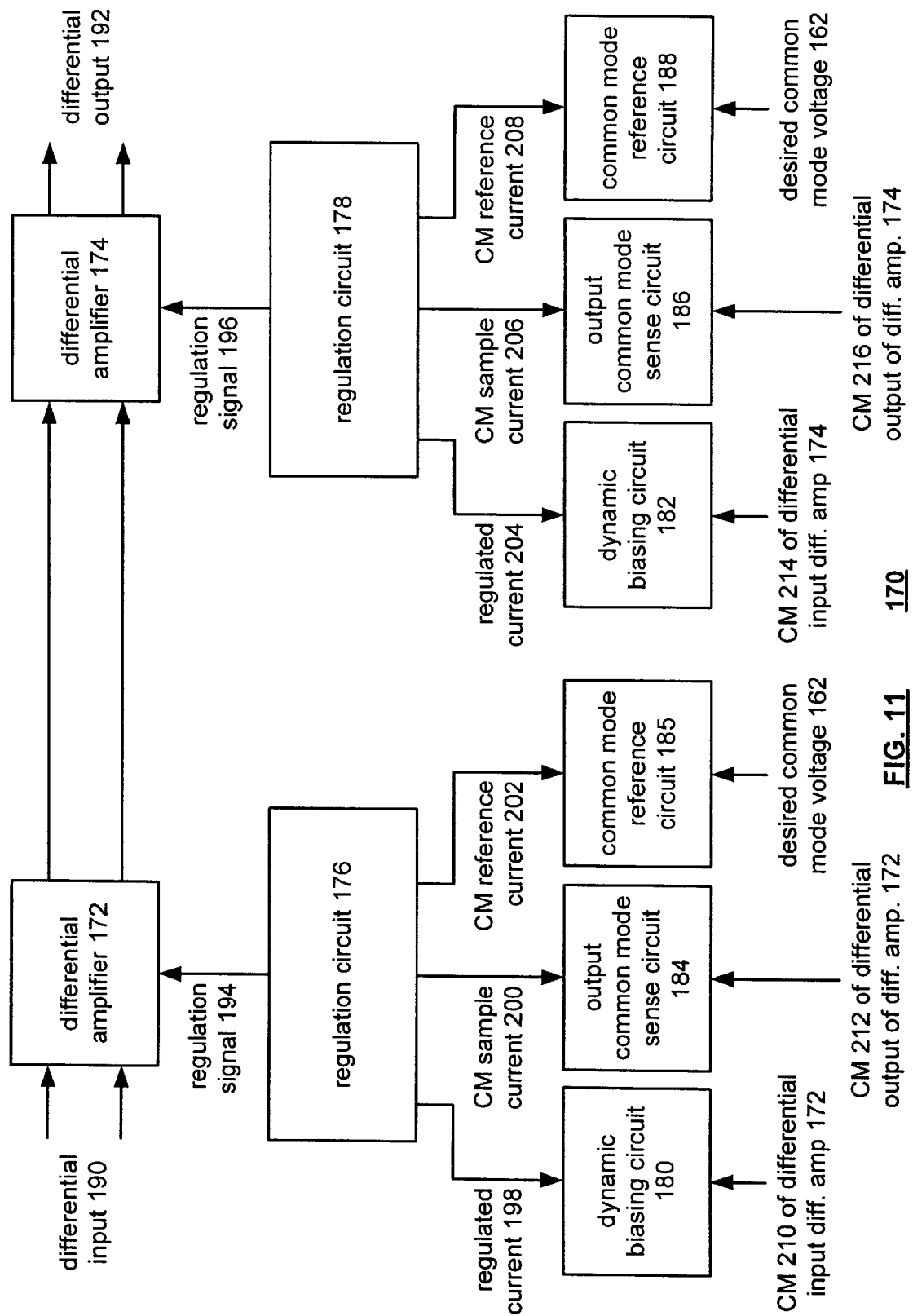
FIG. 11 illustrates a schematic block diagram of an alternate filter in accordance with the present invention.

FIG. 11 illustrates a schematic block diagram of an alternate filter 170 that includes a plurality of cascaded differential amplifiers 172 through 174. The plurality of cascaded differential amplifiers includes a differential input 190 and a differential output 192. Each of the differential amplifiers 172 has a corresponding control circuit that provides a regulation signal 194 or 196. The control circuitry includes a regulation circuit 176 or 178, a dynamic biasing circuit 180 or 182, an output common mode sense circuit 184 or 186 and a common mode reference circuit 185 or 188. The dynamic biasing circuit 180 produces a regulation current 198 based on the common mode 210 of the differential input of differential amplifier 172. The output common mode sense circuit 184 produces a common mode sample current 200 based on the common mode 212 of the differential output of differential amplifier 172. The common mode reference circuit 185 produces a common mode reference current 202 based on the desired common mode voltage 162. The regulation circuit 176 utilizes the regulation current 198, the common mode sample current 200 and the common mode reference current 202 to produce the regulation signal 194.

Dynamic biasing circuit 182 produces a regulated current 204 based on the common mode 214 of the differential input of differential amplifier 174. The output common mode sense circuit 186 produces a common mode sample current 206 based on the common mode 216 of the differential output of differential amplifier 174. The common mode reference circuit 188 produces a common mode reference current 208 based on the desired common mode voltage 162. The regulation circuit 178 produces the regulation signal 196 based on the regulated current 204, the common mode sample current 206 and the common mode reference current 208.

As one of average skill in the art will appreciate, a tuning circuit may be added in the filters illustrated in FIGS. 9–11. For example, a transconductance tuning circuit, as described with reference to FIGS. 7 and 8, may be operably coupled in series with the dynamic biasing circuit 140 (or 180 and 182) and the regulation circuit 138 (or 176 and 178), the common mode reference circuit 144 (or 185 and 188) and the regulation circuit 138 (or 176 and 178), the output common mode sense circuit 142 (or 184 and 186) and the regulation circuit 138 (or 176 and 178). In addition, the transconductance tuning circuit may be operably coupled to the plurality of cascaded differential amplifiers.

The preceding discussion has presented a tunable, dynamic and self-biasing differential amplifier that includes dynamic control circuitry thereby making the differential amplifier substantially insensitive to temperature variations, component mismatches, and other common mode issues. As one of average skill in the art will appreciate, other embodiments may be derived from the teaching of the present invention without deviating from the scope of the claims.

What is claimed is:

1. A tunable, dynamic, self-biasing differential amplifier comprises:

amplifier circuit having a first regulated current source, a second regulated current source, a first input transistor, and a second input transistor, wherein the first input transistor is coupled in series with the first regulated current source, wherein the second input transistor is coupled in series with the second regulated current source, wherein a node of the series coupling between the first regulated current source and the first input transistor forms one node of a differential output, wherein a node of the series coupling between the second regulated current source and the second input transistor forms another node of the differential output, and wherein the first and second input transistors receive a differential input;

current mirror operably coupled to the first and second regulated current sources, wherein current through the current mirror regulates the first and second regulated current sources;

dynamic current regulator operably coupled to provide a regulated current to the current mirror, wherein the dynamic current regulator produces the regulated current based on common mode of the differential input; and dynamic output common mode regulator operably coupled to provide a common mode error signal to the current mirror, wherein the dynamic output common mode regulator produces the common mode error signal based on common mode of the differential output, and wherein the common mode error signal adjusts the current through the current mirror.

2. The tunable, dynamic, self-biasing differential amplifier of claim 1 further comprises:

common mode circuit operably coupled to produce the common mode of the differential input based on sensing at least one of: the differential input and supply voltage.

3. The tunable, dynamic, self-biasing differential amplifier of claim 2, wherein the common mode circuit further comprises:

an adjustable divider circuit operably coupled to provide a representation of the common mode of the differential input.

4. The tunable, dynamic, self-biasing differential amplifier of claim 1, wherein the dynamic current regulator further comprises:

first biasing transistor having a gate, a drain, and a source, wherein the first biasing transistor substantially matches characteristics of the first input transistor; and second biasing transistor having a gate, a drain, and a source, wherein the second biasing transistor substantially matches characteristics of the second input transistor, wherein the gates of the first and second biasing transistors are operably coupled to receive the common mode of the differential input, wherein the sources of the first and second biasing transistors are operably coupled to a return potential, wherein the drains of the first and second biasing transistors are operably coupled to the current mirror, and wherein the regulated current is based on current through the first and second biasing transistors.

5. The tunable, dynamic, self-biasing differential amplifier of claim 1, wherein the dynamic output common mode regulator further comprises:

current regulator that produces a common mode reference current based on a desired common mode voltage;

reference current mirror operably coupled in series with the current regulator, wherein a node between the reference current mirror and the current regulator provides the common mode error signal;

differential output common mode sensing circuit operably coupled to produce a common mode sample current based on the common mode of the differential output; and current mirror controller operably coupled in series with the differential output common mode sensing circuit such that the common mode sample current flows through the current mirror controller, wherein the current mirror controller is operably coupled to the reference current mirror such that the common mode error signal is representative of a difference between the common mode reference current and the common mode sample current.

6. A tunable, dynamic, self-biasing differential amplifier comprises:
   amplifier circuit having a first regulated current source, a second regulated current source, a first input transistor, a second input transistor, a first tuning circuit, and a second tuning circuit, wherein the first input transistor, the first regulated current source, and the first tuning circuit are coupled in series, wherein the second input transistor, the second regulated current source, and the second tuning circuit are coupled in series, wherein a node of the series coupling between the first regulated current source and the first tuning circuit forms one node of a differential output, wherein a node of the series coupling between the second regulated current source and the second tuning circuit forms another node of the differential output, and wherein the first and second input transistors receive a differential input;
   current mirror operably coupled to the first and second regulated current sources, wherein current through the current mirror regulates the first and second regulated current sources;
   dynamic current regulator operably coupled to provide a regulated current to the current mirror, wherein the dynamic current regulator produces the regulated current based on common mode of the differential input and on a transconductance tuning signal; and
   dynamic output common mode regulator operably coupled to provide a common mode error signal to the current mirror, wherein the dynamic output common mode regulator produces the common mode error signal based on common mode of the differential output and the transconductance tuning signal, and wherein the common mode error signal adjusts the current through the current mirror.

7. The tunable, dynamic, self-biasing differential amplifier of claim 6 further comprises:
   common mode circuit operably coupled to sense the differential input and to produce, therefrom, the common mode of the differential input.

8. The tunable, dynamic, self-biasing differential amplifier of claim 6, wherein the dynamic current regulator further comprises:
   first biasing transistor having a gate, a drain, and a source, wherein the first biasing transistor substantially matches characteristics of the first input transistor;
   second biasing transistor having a gate, a drain, and a source, wherein the second biasing transistor substantially matches characteristics of the second input transistor;
   first bias tuning circuit operably coupled to receive the transconductance tuning signal, wherein the first bias tuning circuit is operably coupled to the drain of the first biasing transistor; and
   second bias tuning circuit operably coupled to receive the transconductance tuning signal, wherein the second bias tuning circuit is operably coupled to the drain of the second biasing transistor, wherein the gates of the first and second biasing transistors are operably coupled to receive the common mode of the differential input, wherein the sources of the first and second biasing transistors are operably coupled to a return potential, wherein the first and second bias tuning circuits are operably coupled to the current mirror, wherein the regulated current is based on current through the first and second biasing transistors, and wherein the current through the first and second biasing transistors is based on the transconductance tuning signal.

9. The tunable, dynamic, self-biasing differential amplifier of claim 6, wherein the dynamic output common mode regulator further comprises:
   current regulator that produces a common mode reference current based on a desired common mode voltage and on the transconductance tuning signal;
   current mirror operably coupled in series with the current regulator, wherein a node between the current mirror and the current regulator provides the common mode error signal;
   differential output common mode sensing circuit operably coupled to produce a common mode sample current based on the common mode of the differential output and the transconductance tuning signal; and
   current mirror controller operably coupled in series with the differential output common mode sensing circuit such that the common mode sample current flows through the current mirror controller, wherein the current mirror controller is operably coupled to the current mirror such that the common mode error signal is representative of a difference between the common mode reference current and the common mode sample current.

10. A dynamic output common mode regulator comprises:
    current regulator that produces a common mode reference current based on a desired common mode voltage;
    current mirror operably coupled in series with the current regulator, wherein a node between the current mirror and the current regulator provide a common mode error signal;
    differential output common mode sensing circuit operably coupled to produce a common mode sample current based on common mode of an output of a differential amplifier; and
    current mirror controller operably coupled in series with the differential output common mode sensing circuit and to the current mirror, wherein the common mode error signal is representative of a difference between the common mode reference current and the common mode sample current.

11. The dynamic output common mode regulator of claim 10, wherein the current regulator further comprises:
    first transistor having a gate, a drain, and a source; and
    second transistor having a gate, a drain, and a source, wherein the gates of the first and second transistors are operably coupled to receive the desired common mode voltage, wherein the sources of the first and second transistors are operably coupled to a return potential, wherein the drains of the first and second transistors are operably coupled to the current mirror, and wherein the common mode reference current is based on currents through the first and second transistors.

12. The dynamic output common mode regulator of claim 10, wherein the differential common mode sensing circuit further comprises:
    first transistor having a gate, a drain, and a source; and
    second transistor having a gate, a drain, and a source, wherein the gates of the first and second transistors are operably coupled to the output of the differential amplifier, wherein the sources of the first and second transistors are operably coupled to a return potential, wherein the drains of the first and second transistors are operably coupled to the current mirror controller, and wherein the common mode sample current is based on currents through the first and second transistors.

13. The dynamic output common mode regulator of claim 10 further comprises:
common mode circuit operably coupled to sense a supply potential and a return potential and to produce, therefrom, the desired common mode voltage.

14. The dynamic output common mode regulator of claim 13, wherein the common mode circuit further comprises:
an adjustable divider circuit operably coupled to provide a representation of the desired common mode voltage.

15. The dynamic output common mode regulator of claim 10 further comprises:
transconductance tuning circuit operably coupled in series with the current regulator and the current mirror and operably coupled in series with the differential output common mode sensing circuit and the current mirror controller, wherein the transconductance tuning circuit regulates transconductance of transistors within the current regulator and of the differential output common mode sensing circuit.

16. A dynamic and tunable filter comprises:
a plurality of cascaded differential amplifiers;
dynamic biasing circuit operably coupled to produce a regulated current based on common mode of a differential input of at least one of the plurality of cascaded differential amplifiers;
output common mode sense circuit operably coupled to produce a common mode sample current based on common mode of a differential output of the at least one of the plurality of cascaded differential amplifiers;
common mode reference circuit operably coupled to produce a common mode reference current based on a desired common mode voltage; and
regulation circuit operably coupled to the plurality of differential amplifiers, the dynamic biasing circuit, the output common mode sense circuit, and the common mode reference circuit, wherein the regulation circuit produces a regulation signal based on the regulated current, the common mode sample current, and the common mode reference current, wherein the regulation circuit provides the regulation signal to the plurality of differential amplifiers to dynamically adjust at least one of biasing, input common mode, and output common mode of each of the plurality of cascaded differential amplifiers.

17. The dynamic and tunable filter of claim 16, wherein the at least one of the plurality of cascaded differential amplifiers further comprises:
first regulated current source;
second regulated current source;
first input transistor; and
second input transistor; wherein the first input transistor is coupled in series with the first regulated current source, wherein the second input transistor is coupled in series with the second regulated current source, wherein a node of the series coupling between the first regulated current source and the first input transistor forms one node of the differential output, wherein a node of the series coupling between the second regulated current source and the second input transistor forms another node of the differential output, wherein the first and second input transistors receive the differential input, and wherein the first and second regulated current sources are regulated based on the regulation signal.

18. The dynamic and tunable filter of claim 17, wherein the dynamic biasing circuit further comprises:

first biasing transistor having a gate, a drain, and a source, wherein the first biasing transistor substantially matches characteristics of the first input transistor; and
second biasing transistor having a gate, a drain, and a source, wherein the second biasing transistor substantially matches characteristics of the second input transistor, wherein the gates of the first and second biasing transistors are operably coupled to receive the common mode of the differential input of the at least one of the plurality of cascaded differential amplifiers, wherein the sources of the first and second biasing transistors are operably coupled to a return potential, wherein the drains of the first and second biasing transistors are operably coupled to the regulation circuit, and wherein the regulated current is based on current through the first and second biasing transistors.

19. The dynamic and tunable filter of claim 18, wherein the common mode reference circuit further comprises:
first common mode reference transistor having a gate, a source, and a drain; and
second common mode reference transistor having a gate, a source, and a drain, wherein the gates of the first and second common mode reference transistors are operably coupled to receive the desired common mode voltage, wherein the sources of the first and second common mode reference transistors are operably coupled to the return potential, and wherein the drains of the first and second common mode reference transistors provide the common mode reference current.

20. The dynamic and tunable filter of claim 19, wherein the output common mode sense circuit further comprises:
first common mode sense transistor having a gate, a source, and a drain; and
second common mode sense transistor having a gate, a source, and a drain, wherein the gates of the first and second common mode sense transistors are operably coupled to receive the differential output of the at least one of the plurality of cascaded differential amplifiers, wherein the sources of the first and second common mode sense transistors are operably coupled to the return potential, and wherein the drains of the first and second common mode sense transistors provide the common mode sample current.

21. The dynamic and tunable filter of claim 20, wherein the regulation circuit further comprises:
current mirror controller operably coupled in series with the output common mode sense circuit such that the common mode sample current flows through the current mirror controller;
current mirror operably coupled in series with the common mode reference circuit and operably coupled to the current mirror controller, wherein current flowing through the current mirror is the common mode reference current plus an error current, and wherein the error current is representative of difference between the common mode sample current and the common mode reference current; and
second current mirror operably coupled to the first and second regulated current sources of the at least one of the plurality of cascaded differential amplifiers and operably coupled to the current mirror, wherein current through the second current mirror regulates, as the regulation signal, the first and second regulated current sources, wherein the current through the second current source is based on the regulated current and the error current.

22. The dynamic and tunable filter of claim 16, wherein each of the plurality of cascaded differential amplifiers further comprises:

first regulated current source;

second regulated current source;

first input transistor; and second input transistor, wherein the first input transistor is coupled in series with the first regulated current source, wherein the second input transistor is coupled in series with the second regulated current source, wherein a node of the series coupling between the first regulated current source and the first input transistor forms one node of a differential output of the each of the plurality of cascaded differential amplifiers, wherein a node of the series coupling between the second regulated current source and the second input transistor forms another node of the differential output of the each of the plurality of cascaded differential amplifiers, wherein the first and second input transistors receive a differential input for the each of the plurality of cascaded differential amplifiers, and wherein the first and second regulated current sources are regulated based on the regulation signal.

23. The dynamic and tunable filter of claim 22, wherein the dynamic biasing circuit further comprises:

plurality of biasing modules, each operably coupled to a corresponding one of the plurality of cascaded differential amplifiers, wherein each of the plurality of biasing modules includes:

first biasing transistor having a gate, a drain, and a source, wherein the first biasing transistor substantially matches characteristics of the first input transistor; and second biasing transistor having a gate, a drain, and a source, wherein the second biasing transistor substantially matches characteristics of the second input transistor, wherein the gates of the first and second biasing transistors are operably coupled to receive the differential input for the each of the plurality of cascaded differential amplifiers, wherein the sources of the first and second biasing transistors are operably coupled to a return potential, wherein the drains of the first and second biasing transistors are operably coupled to the regulation circuit, and wherein the regulated current is based on current through the first and second biasing transistors.

24. The dynamic and tunable filter of claim 23, wherein the common mode reference circuit further comprises:

a plurality of common mode reference modules, each operably coupled to the corresponding one of the plurality of cascaded differential amplifiers, wherein each of the plurality of common mode reference modules includes:

first common mode reference transistor having a gate, a source, and a drain; and second common mode reference transistor having a gate, a source, and a drain, wherein the gates of the first and second common mode reference transistors are operably coupled to receive the desired common mode voltage, wherein the sources of the first and second common mode reference transistors are operably coupled to the return potential, and wherein the drains of the first and second common mode reference transistors provide the common mode reference current.

25. The dynamic and tunable filter of claim 24, wherein the output common mode sense circuit further comprises:

plurality of output common mode modules, each operably coupled to the corresponding one of the plurality of cascaded differential amplifiers, wherein each of the plurality of output common mode modules includes:

first common mode sense transistor having a gate, a source, and a drain; and second common mode sense transistor having a gate, a source, and a drain, wherein the gates of the first and second common mode sense transistors are operably coupled to receive the differential output of the at least one of the plurality of differential amplifiers, wherein the sources of the first and second common mode sense transistors are operably coupled to the return potential, and wherein the drains of the first and second common mode sense transistors provide the common mode sample current.

26. The dynamic and tunable filter of claim 25, wherein the regulation circuit further comprises:

a plurality of regulation modules, each operably coupled to the corresponding one of the plurality of cascaded differential amplifiers, wherein each of the plurality of regulation modules includes:

current mirror controller operably coupled in series with the differential output common mode sensing circuit such that the common mode sample current flows through the current mirror controller;

current mirror operably coupled in series with the common mode reference circuit and operably coupled to the current mirror controller, wherein current flowing through current mirror is the common mode reference current plus an error current, and wherein the error current is representative of difference between the common mode sample current and the common mode reference current; and second current mirror operably coupled to the first and second regulated current sources of the corresponding one of the plurality of cascaded differential amplifiers and operably coupled to the current mirror, wherein current through the second current mirror regulates, as the regulation signal, the first and second regulated current sources, wherein the current through the second current source is based on the regulated current and the error current.

27. The dynamic and tunable filter of claim 16 further comprises:

a transconductance tuning circuit operably coupled in series with the dynamic biasing circuit and the regulation circuit, the common mode reference circuit and the regulation circuit, the output common mode sense circuit and the regulation circuit, wherein the transconductance tuning circuit is operably coupled to the plurality of cascaded differential amplifiers, and wherein the transconductance tuning circuit regulates transconductance of transistors within the dynamic biasing circuit, the common mode reference circuit, the plurality of cascaded differential amplifiers, and the output common mode sense circuit.

* * * * *